United States Patent
Curry et al.

(10) Patent No.: US 6,794,924 B2
(45) Date of Patent: Sep. 21, 2004

(54) APPARATUS AND METHOD FOR MINIMIZING SPURIOUS HARMONIC NOISE IN SWITCHED CURRENT STEERING ARCHITECTURES

(75) Inventors: Clifford Curry, Seattle, WA (US);
Brandon D. Day, Kent, WA (US);
James R. Dean, Redmond, WA (US);
Jason D. Moffatt, Kent, WA (US);
Kaila G. Raby, Auburn, WA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/934,775

(22) Filed: Aug. 21, 2001

(65) Prior Publication Data

US 2002/0190778 A1 Dec. 19, 2002

Related U.S. Application Data

(60) Provisional application No. 60/293,445, filed on May 24, 2001.

(51) Int. Cl.[7] ............................................. H03K 17/62
(52) U.S. Cl. ...................................... 327/408; 327/387
(58) Field of Search ................................ 327/408, 379, 327/384, 387

(56) References Cited

U.S. PATENT DOCUMENTS

| | | | | |
|---|---|---|---|---|
| 4,733,097 A | * | 3/1988 | Iwabuchi et al. | ............ 348/250 |
| 5,097,338 A | * | 3/1992 | Kuriyama et al. | ........... 358/471 |
| 5,204,982 A | * | 4/1993 | Cooperman | .................. 327/379 |
| 5,483,188 A | * | 1/1996 | Frodsham | .................... 327/170 |
| 5,825,219 A | * | 10/1998 | Tsai | ............................ 327/112 |
| 6,424,320 B1 | * | 7/2002 | Callway | ...................... 345/1.1 |
| 6,449,194 B1 | * | 9/2002 | Akiyoshi | ............... 365/189.02 |
| 6,452,151 B1 | * | 9/2002 | Tamagawa | ............... 250/208.1 |

* cited by examiner

Primary Examiner—Timothy P. Callahan
Assistant Examiner—Cassandra Cox
(74) Attorney, Agent, or Firm—Graybeal Jackson Haley LLP

(57) ABSTRACT

A switched current steering device includes a switch activation unit coupled to a set of actual switches and an associated set of dummy switches. Based upon current actual switch states, next actual switch states as specified by a data stream, and current dummy switch states, the switch activation unit selectively generates dummy signals that indicate or specify next dummy switch states. The switch activation unit generates the dummy signals such that the total number of actual switches and dummy switches experiencing state transitions remains constant from one switching cycle to another.

21 Claims, 5 Drawing Sheets

APPARATUS AND METHOD FOR MINIMIZING SPURIOUS HARMONIC NOISE IN SWITCHED CURRENT STEERING ARCHITECTURES

RELATED APPLICATIONS

This application claims priority to U.S. Provisional Patent Application Ser. No. 60/293,445, entitled "A Method for Reducing the Spurious Outputs of High Speed Digital-to-Analog Converters," filed on May 24, 2001.

BACKGROUND OF THE INVENTION

1. Field of the Invention

The present invention relates to techniques for minimizing third order harmonic output signal spurs in architectures having switched current steering elements. More particularly, the present invention comprises an apparatus and method for minimizing harmonic output signal spurs via a set of dummy switches that selectively operate in conjunction with a set of actual switches.

2. Description of the Background Art

An ideal or hypothetical electrical system or circuit may operate upon a set of input signals to generate one or more corresponding output signals having intended or pure spectral content. Real-world electrical systems or circuits, however, produce or generate noise components that may corrupt, interfere with, or distort a desired output signal frequency or frequency band.

Harmonic noise components arise from electrical mixing of frequencies, which causes difference and sum frequencies to appear in an output signal. Such electrical mixing may involve one or more input signal frequencies, as well as one or more frequencies associated with internal circuit operation. Third order harmonic noise components are commonly believed to arise from distortion mechanisms caused by circuit non-linearity. However, third order harmonic noise components may alternatively or additionally imply a dependence upon the states of one or more input signals.

A variety of systems and circuits, such as Digital to Analog Converters (DACs), may include switches that control current steering elements. The current steering elements direct electrical current from one output to another. In a current steering DAC, timing mismatch between activated switches, as well as variations in switch operation or activation sequences as a function of changes in input data over time, contribute to the generation of harmonic output signal noise components.

As input signal frequency, and hence switching frequency, increases, harmonic output signal noise undesirably increases, and Spurious Free Dynamic Range (SFDR) correspondingly degrades. One approach toward minimizing or controlling spurious harmonic output signal noise is through the use of a sample and hold architecture. In a sample and hold architecture, circuit outputs are temporarily disconnected from output signal generating elements at the time at which switching is to occur. After a predetermined settling time has elapsed, the circuit outputs are reconnected to the output signal generating elements, whereupon output signals may be delivered or transmitted. Unfortunately, to ensure error free operation, sample and hold circuitry must operate at twice the speed of the output signal generating elements. This constraint becomes significantly more difficult to meet at higher frequencies.

Another approach toward minimizing harmonic output signal noise is commonly referred to as dynamic element matching. In dynamic element matching, pseudo-random bit sequences selectively determine whether particular switches that were in an on state during a most-recent output signal generation cycle, and which would normally remain in an on state during a next output signal generation cycle, shall be turned off between output signal generation cycles. This results in an averaging of harmonic output signal noise components because different numbers of switches are activated during each output signal generation cycle. Unfortunately, dynamic element matching also results in an increase in a circuit's noise floor, which reduces the circuit's dynamic range.

SUMMARY OF THE INVENTION

In one embodiment, the present invention comprises a set of activation modules coupled to a set of switch modules. A switch module may comprise an actual driver coupled to an actual switch; and a dummy driver coupled to a dummy switch. An activation module may comprise an actual signal latch, a dummy signal latch, and dummy signal logic.

An activation module may receive signals or bits corresponding to or derived from an incoming signal or data stream, where such incoming signals specify or indicate a next actual state associated with an actual switch. Based upon the current state of an actual switch, the next state of the actual switch, and the current state of a dummy switch associated therewith, the activation module may selectively generate a dummy signal or bit to cause the dummy switch to experience a state transition. In particular, if the current and next states of the actual switch are identical, the dummy signal causes the dummy switch to undergo a state transition. If the current and next states of the actual switch differ, the dummy switch is maintained in its current state.

Taken across multiple switch modules, the present invention may ensure that the total number of switches (i.e., actual switches and dummy switches taken together) that experience state transitions at any given time remains constant. As a result, the present invention may greatly reduce or essentially eliminate a major or dominant contribution to third order spurious harmonic noise.

Figure 3:
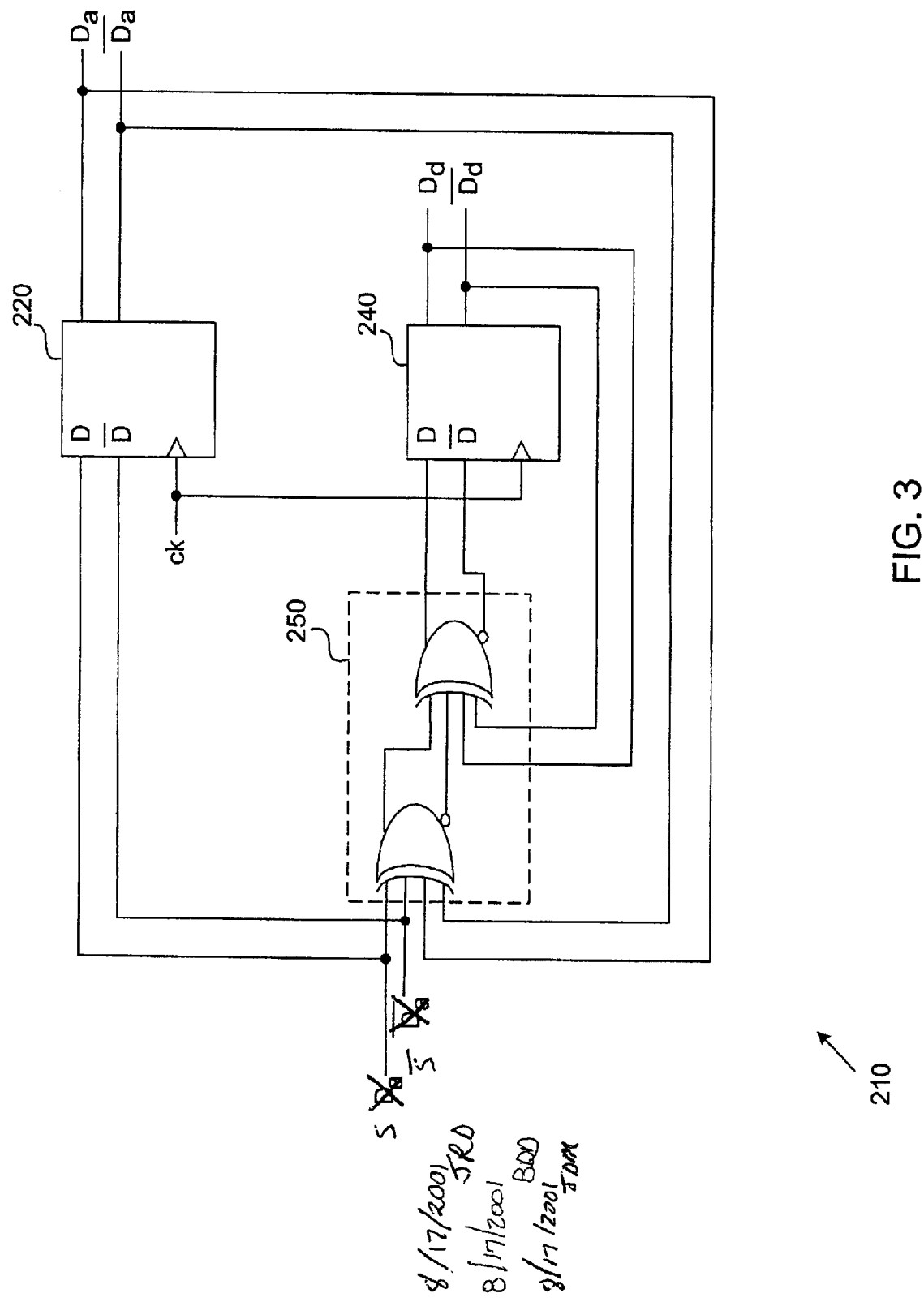
FIG. 3 is a circuit diagram of a activation module according to an embodiment of the invention.

Table 1 is a truth table corresponding to logic shown in FIG. 3.

DETAILED DESCRIPTION

Figure 1:
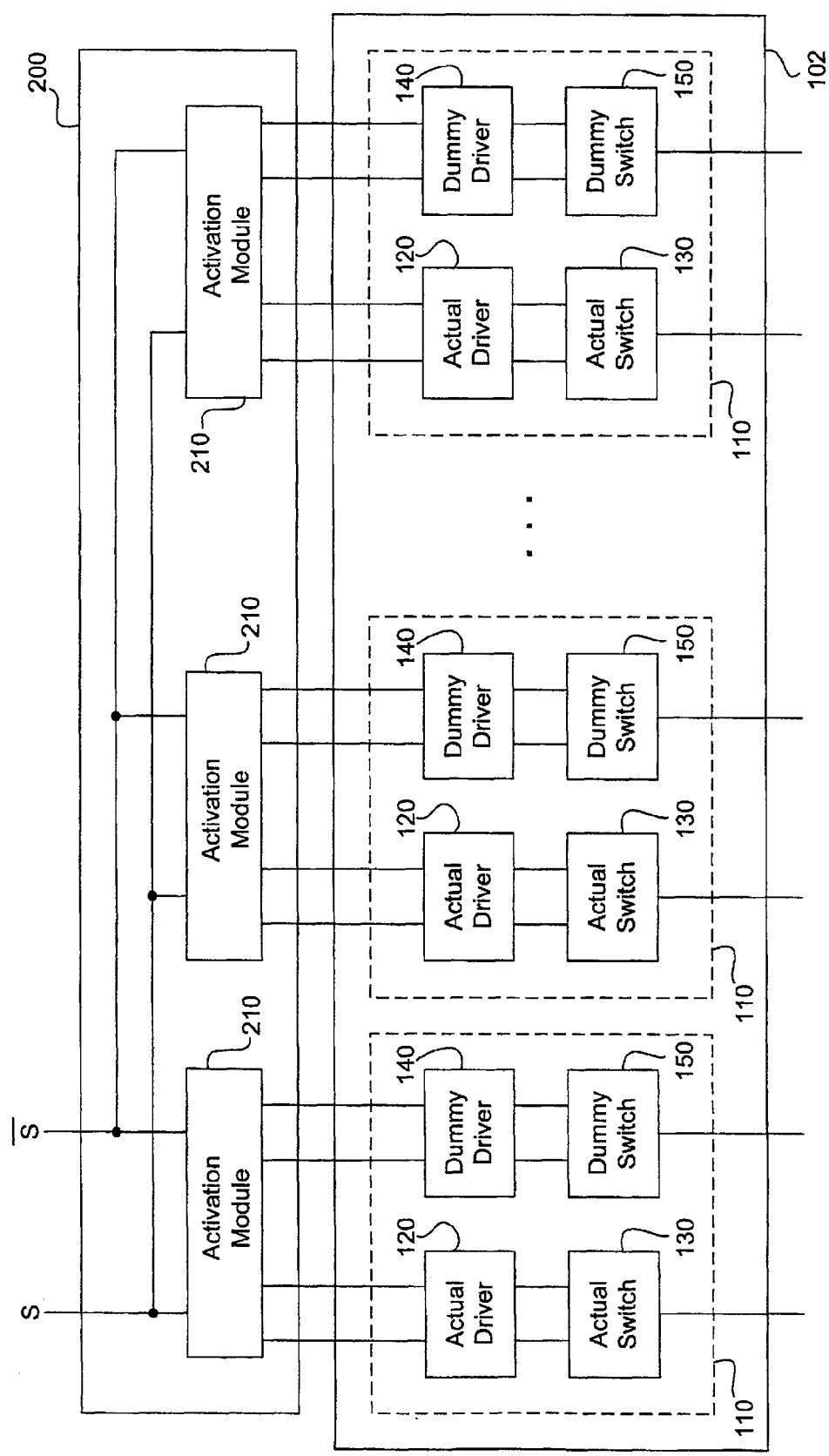
FIG. 1 is a block diagram of an apparatus for minimizing spurious harmonic noise in switched current steering architectures according to an embodiment of the invention.

FIG. 1 is a block diagram of an apparatus 100 for minimizing spurious harmonic noise in switched current steering architectures according to an embodiment of the invention. In one embodiment, the apparatus 100 comprises a switching unit 102 coupled to a switch activation unit 200. The switching unit 102 may include a set of switch modules 110, each of which is coupled to a corresponding activation module 210 within the switch activation unit 200. Each switch module 110 may comprise an actual switch driver 120, an actual switch 130, a dummy switch driver 140, and a dummy switch 150.

The switch activation unit 200 receives an input signal or data stream S, which in one embodiment comprises actual data signals or bits $D_a$ and their complements. Particular actual data bits and/or their complements may be directed toward particular switch modules 110. As described in detail below, the switch activation unit 200 selectively generates dummy data signals or bits $D_d$, and outputs or delivers actual data signals and dummy data signals to actual and dummy switches 130, 150, respectively.

The present invention may minimize or eliminate third order harmonic noise components arising from digital switching transients by providing a constant, essentially constant, or well controlled switching noise environment. In one embodiment, the switch activation unit 200 selectively activates an actual switch 130 or a dummy switch 150 within each switch module 110 in the apparatus 100 during any given switching cycle. As a result, the total number of switches undergoing state transitions from one switching cycle to another remains constant. The present invention eliminates variations in switch activation sequences as a function of input signal changes over time, thereby eliminating a major or dominant contribution to third order harmonic noise. The present invention may be particularly advantageous or useful in applications such as digital radio, cellular telephony, wireless communications, or waveform generation.

Figure 2:
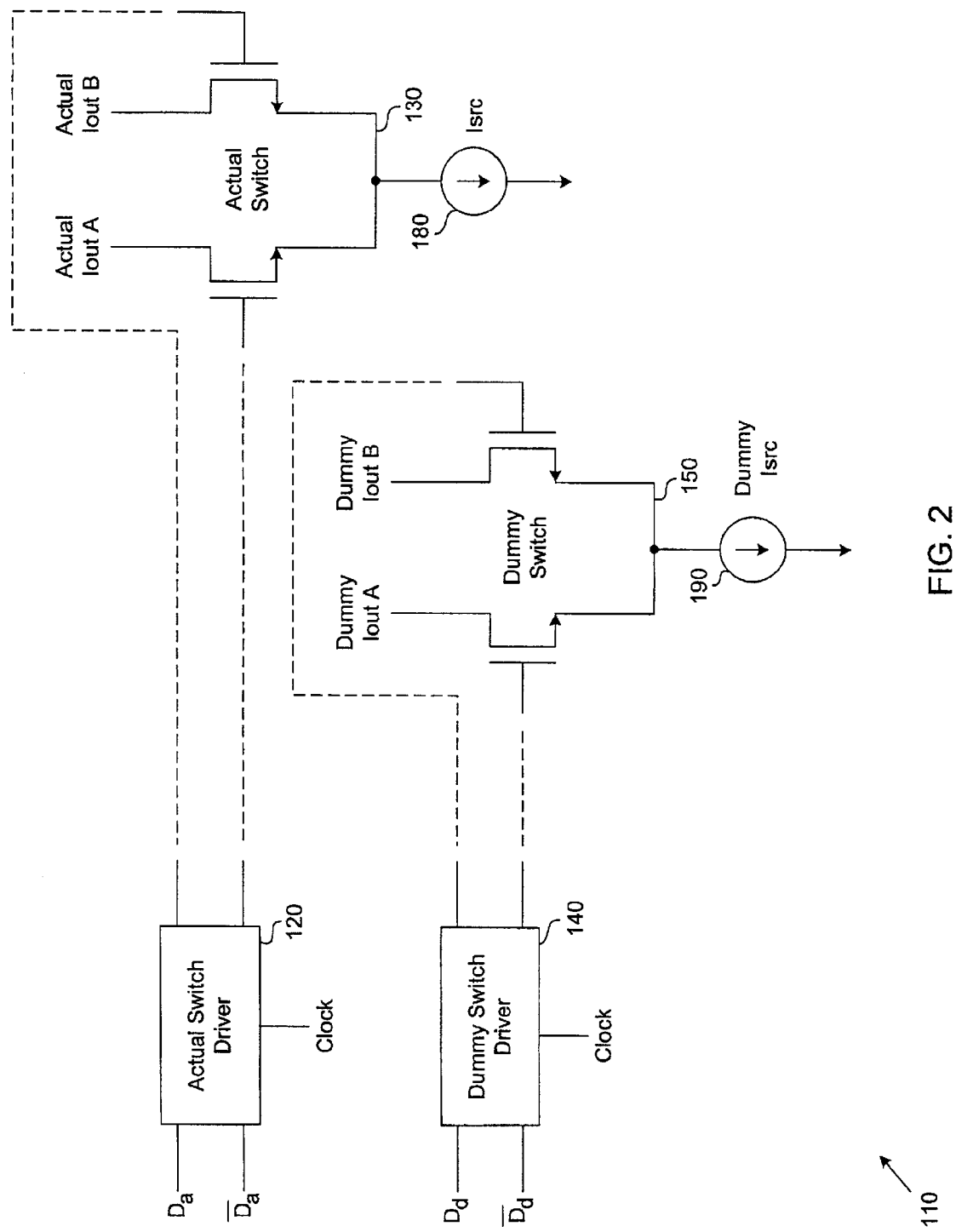
FIG. 2 is a block diagram of a switch module according to an embodiment of the invention.

FIG. 2 is a block diagram of a switch module 110 according to an embodiment of the invention. The actual switch 130 may comprise a current steering element, in a manner readily understood by those skilled in the art. The actual switch 130 may be coupled to a first current source 180, and may provide or generate a first and a second actual output signal. An actual switch 130 may be conventional, having a structure analogous or identical to a current steering element within a conventional Digital to Analog Converter (DAC), for example. The actual switch driver 120 may comprise circuitry for driving the current steering element to which it is coupled, and may be conventional.

The dummy switch 150 may comprise a current steering element, and the dummy switch driver 140 may comprise circuitry for driving the current steering element to which it is coupled. The dummy switch 150 may be coupled to a second current source 190, and may provide or generate a first and a second dummy output signal in a manner analogous to that for the actual switch 130.

In one embodiment, the first and second current sources 180, 190 provide different levels of electrical current to the actual and dummy switch 130, 150, respectively. The actual switch 130 and the dummy switch 150, however, may provide or correspond to an identical or essentially identical electrical load.

The dummy switch driver 140 and the dummy switch 150 may be structurally analogous or identical to an actual switch driver 120 and an actual switch 130, respectively. In one embodiment, the present invention includes a dummy switch 150 corresponding to each actual switch 130. An exemplary embodiment of the present invention may include twenty five switch modules 110, thereby providing or incorporating twenty five actual switches 130 and twenty five corresponding dummy switches 150. In such an embodiment, the second current source 190 may provide a current that is less than that provided by the first current source 180 by approximately an order of magnitude.

In one embodiment, an actual switch driver 120 is coupled to receive an actual data bit $D_a$ and its complement from the switch activation unit 200. The actual switch driver 120 drives the actual switch 130 in accordance with the actual data bit and its complement, in a manner readily understood by those skilled in the art.

A dummy switch driver 140 may be coupled to receive a dummy data bit $D_d$ and its complement from the switch activation unit 200. The dummy switch driver 140 may drive the dummy switch 150 in accordance with the dummy bit and its complement, in a manner readily understood by those skilled in the art.

FIG. 3 is a circuit diagram of an activation module 210 according to an embodiment of the invention. In one embodiment, the activation module 210 comprises an actual signal latch or flip-flop 220, a dummy signal latch or flip-flop 240, and dummy signal logic 250. The actual signal latch 220 and the dummy signal logic 250 are coupled to receive input signals from, corresponding to, or specified in accordance with the input signal stream S. In particular, the actual signal latch 220 and the dummy signal logic 250 may be coupled receive an actual bit $D_a$ and its complement, where the actual bit $D_a$ corresponds to a particular bit position and/or power of two within the input data stream S. The dummy signal logic 250 is coupled to deliver one or more dummy signals or bits to the dummy signal latch 240. The actual signal latch 220 and the dummy signal latch 240 are coupled to an actual switch driver 120 and a dummy switch driver 140, respectively, within a corresponding switch module 110. Additionally, the dummy signal logic 250 is coupled to outputs of the actual and dummy signal latches 220, 240.

Input signals received by an activation module 210 may be defined or designated as specifying a next actual state (NAS), indicating a next state for the actual switch 130 coupled to the activation module 210. Signals currently output by the actual signal latch 220 may be defined as specifying a present actual state (PAS), indicating a present or current state for the actual switch 130 coupled to the activation module 210. Similarly, signals generated or output by the dummy signal logic 250 may be defined as specifying a next dummy state (NDS), indicating a next state for a dummy switch 150 coupled to the activation module 210. Finally, signals currently output by the dummy signal latch 240 may be defined as specifying a present dummy state (PDS), indicating a present or current state for the dummy switch 150 coupled to the activation module 210.

Table 1 is a truth table corresponding to the dummy signal logic 250 of FIG. 3. Present and next states associated with an actual and a dummy switch 130, 150 are defined in the manner described above. The dummy signal logic 250 may operate in accordance with the truth table to generate a dummy data signal, such as a dummy data bit $D_d$ and its complement. Via the dummy signal latch 240, the dummy data bit $D_d$ and its complement may be delivered or issued to a dummy switch 150 during a next switching cycle. The dummy signal latch 240 may deliver the dummy signal to a dummy switch 150 in conjunction with the actual signal latch 220 delivering an actual signal to an actual switch 130.

TABLE 1

| Actual Switches | | Dummy Switches | |
| --- | --- | --- | --- |
| NAS | CAS | CDS | NDS |
| 0 | 0 | 0 | 1 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 0 |

In the event that a next actual state differs from a current actual state associated with an actual switch 130, the dummy signal logic 250 may ensure that the state of a corresponding dummy switch 150 remains unchanged. In the event that a next actual state is identical to a current actual state associated with an actual switch 130, the dummy signal logic 250 may ensure that dummy switch 150 associated with the actual switch undergoes a switching transition.

The dummy logic 250 may therefore selectively cause a dummy switch 150 coupled thereto to undergo a switching transition when the state of an actual switch 130 corresponding to or associated with the dummy switch 150 will remain unchanged from a present switching cycle to a next switching cycle. The present invention may thereby ensure that the total number of actual and dummy switches 130, 150 that experience switching transitions in any given switching cycle remains constant across the switching modules 110. As a result, switching power and noise profile may remain constant or essentially constant from one switching cycle to another.

Figure 4:
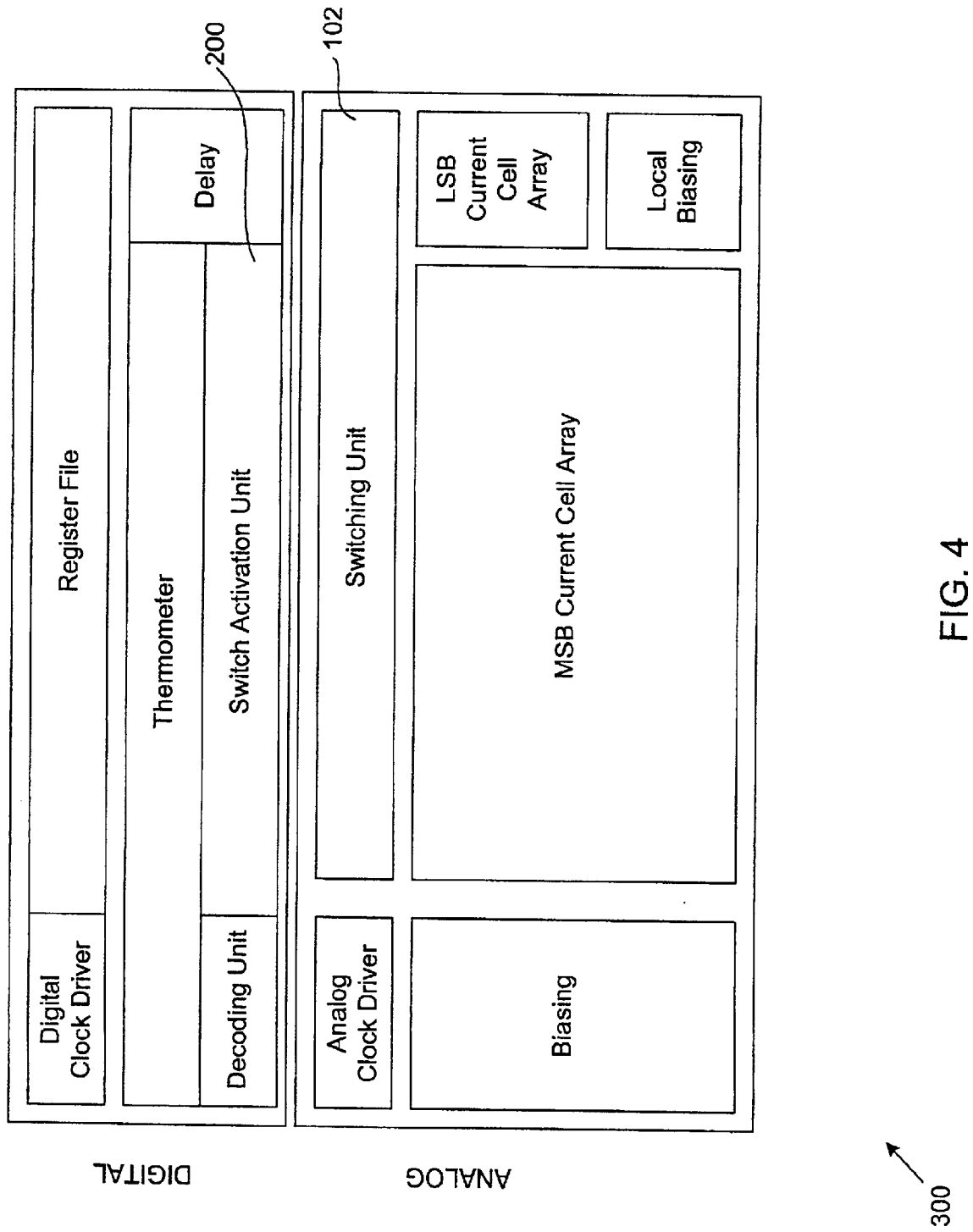
FIG. 4 is a floorplan diagram of a Digital to Analog Converter that incorporates an embodiment of the invention.

FIG. 4 is an architectural floorplan of a Digital to Analog Converter 300 according to an embodiment of the invention. Within the DAC 300, a switch activation unit 200 corresponds to and/or resides within a digital portion of the DAC 300, while a switching unit 102 corresponds to and/or resides within an analog portion of the DAC 300, in a manner readily understood by those skilled in the art.

Figure 5:
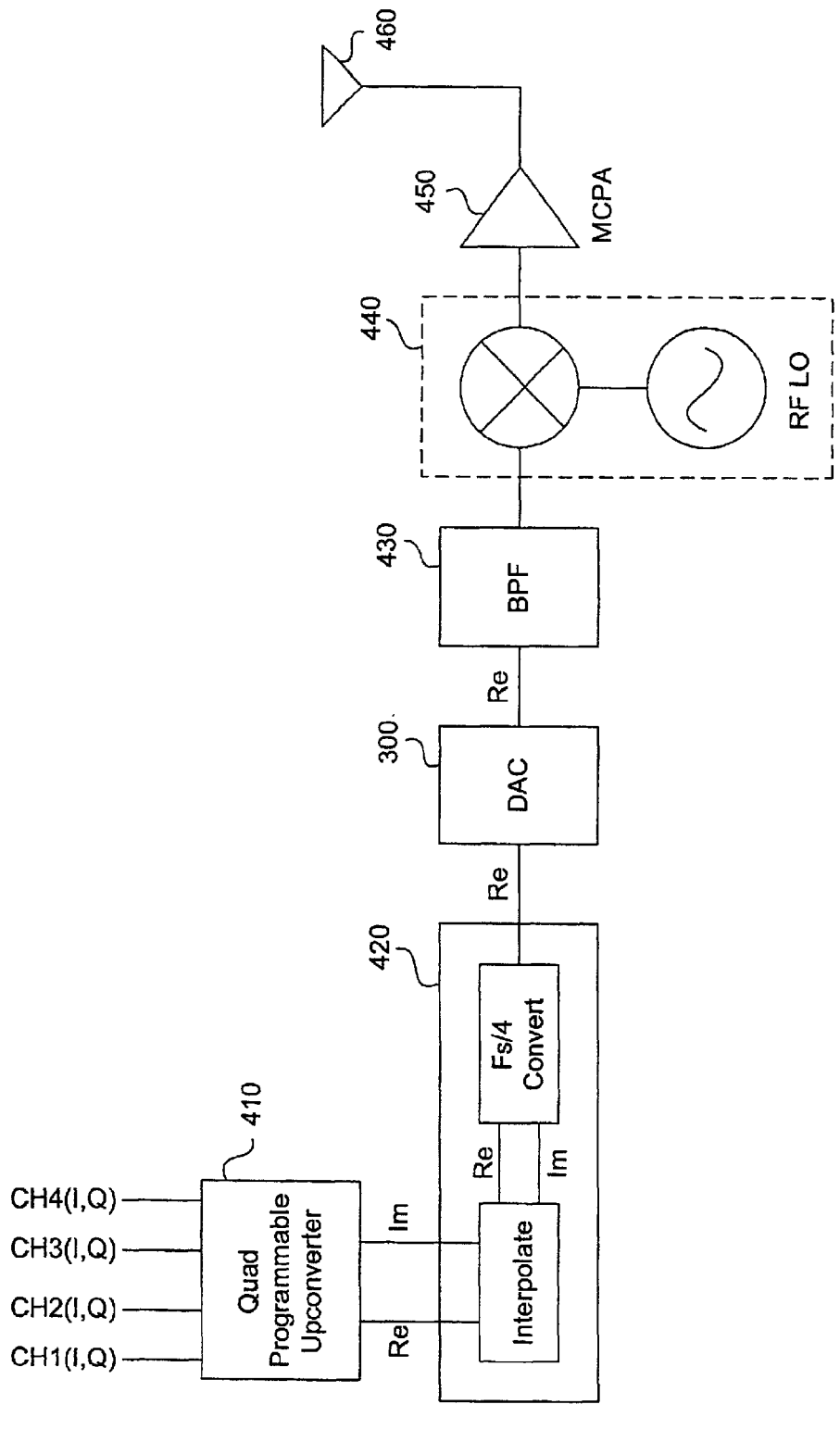
FIG. 5 is a block diagram of a broadband upconversion system constructed in accordance with an embodiment of the invention.

FIG. 5 is a block diagram of a broadband upconversion system 400 according to an embodiment of the invention. In one embodiment, the broadband upconversion system 400 comprises a programmable upconversion stage 410, an interpolation stage 420, a DAC 300, a bandpass stage 430, a local oscillator mixing stage 440, a power amplification stage 450, and an antenna 460.

The programmable upconversion stage 410 may filter and upconvert baseband data to intermediate bandpass data in accordance with one or more programmable channels. The interpolation stage 420 may increase a sample rate of the bandpass data by an integer factor, and may also upconvert the intermediate bandpass data to a second intermediate frequency. The bandpass stage 430 may filter the second intermediate frequency signal output by the DAC 300. The local oscillator mixing stage 440 may upconvert the second intermediate frequency signal to a desired radio frequency. The power amplification stage 450 may amplify the radio frequency signal to a sufficient power level for transmission through a medium. Finally, the antenna 460 may transmit the radio frequency signal in the form of an electromagnetic radio wave.

The general principles described herein may be applied to embodiments and applications other than those detailed above without departing from the spirit and scope of the present invention as defined by the appended claims. As an example, a switched current steering architecture may include a number of dummy switches that is different from a number of actual switches. The present invention is to be accorded the widest scope consistent with the principles and features disclosed herein, and is limited only by the following claims:

What is claimed is:

1. A switched current steering device comprising:
   an actual switch coupled to an actual output node and operable to receive an input signal sequence that indicates a set of state transitions associated with the actual switch; and
   a dummy switch coupled to a dummy node and operable to receive a dummy signal sequence that indicates a set of state transitions associated with the dummy switch, the dummy signal sequence indicating state transitions that are mutually exclusive of state transitions indicated by the input signal sequence.

2. A switched current steering device comprising:
   an actual switch coupled to an actual output node and operable to receive an input signal sequence that indicates a set of state transitions associated with the actual switch;
   a dummy switch coupled to a dummy node and operable to receive a dummy signal sequence that indicates a set of state transitions associated with the dummy switch, the dummy signal sequence indicating state transitions that are mutually exclusive of state transitions indicated by the input signal sequence; and
   an activation unit having an input coupled to receive the input signal sequence and an output coupled to provide the dummy signal sequence to the dummy switch.

3. A switched current steering device comprising:
   an actual switch coupled to receive an input signal sequence that indicates a set of state transitions associated with the actual switch;
   a dummy switch coupled to receive a dummy signal sequence that indicates a set of state transitions associated with the dummy switch, the dummy signal sequence indicating state transitions that are mutually exclusive of state transitions indicated by the input signal sequence; and
   an activation unit coupled to receive a next state of the actual switch, a present state of the actual switch, and a present state of the dummy switch, and coupled to provide the dummy signal to the dummy switch.

4. A switched current steering device comprising:
   an actual switch coupled to receive an input signal sequence that indicates a set of state transitions associated with the actual switch;
   a dummy switch coupled to receive a dummy signal sequence that indicates a set of state transitions associated with the dummy switch, the dummy signal sequence indicating state transitions that are mutually exclusive of state transitions indicated by the input signal sequence;
   a first current source coupled to the actual switch;
   a second current source coupled to the dummy switch; and
   wherein the second current source provides a different amount of current than the first current source.

5. A switched current steering device comprising:
   an actual switch coupled to receive an input signal sequence that indicates a set of state transitions associated with the actual switch;

a dummy switch coupled to receive a dummy signal sequence that indicates a set of state transitions associated with the dummy switch, the dummy signal sequence indicating state transitions that are mutually exclusive of state transitions indicated by the input signal sequence;

a first current source coupled to the actual switch;

a second current source coupled to the dummy switch; and wherein the second current source provides less current than the first current source.

6. A switched current steering device comprising:

an actual switch coupled to receive an input signal sequence that indicates a set of state transitions associated with the actual switch;

a dummy switch coupled to receive a dummy signal sequence that indicates a set of state transitions associated with the dummy switch, the dummy signal sequence indicating state transitions that are mutually exclusive of state transitions indicated by the input signal sequence; and wherein the actual switch and the dummy switch form a portion of a digital to analog converter.

7. A switched current steering device comprising:

a plurality of actual switches respectively coupled to a plurality of actual output nodes, each actual switch operable to receive an input signal sequence that indicates a set of state transitions associated with the plurality of actual switches; and a plurality of dummy switches respectively coupled to a plurality of dummy nodes and operable to receive a dummy signal sequence that indicates a set of state transitions associated with the plurality of dummy switches, the dummy signal sequence indicating state transitions that are mutually exclusive of state transitions indicated by the input signal sequence.

8. The switched current steering device of claim 7, wherein the number of dummy switches equals the number of actual switches.

9. The switched current steering device of claim 7, further comprising a switch activation unit coupled to receive the input signal sequence and coupled to provide the dummy signal sequence to the plurality of dummy switches.

10. A switched current steering device comprising:

a plurality of actual switches coupled to receive an input signal sequence that indicates a set of state transitions associated with the plurality of actual switches;

a plurality of dummy switches coupled to receive a dummy signal sequence that indicates a set of state transitions associated with the plurality of dummy switches, the dummy signal sequence indicating state transitions that are mutually exclusive of state transitions indicated by the input signal sequence; and a switch activation unit coupled to receive a set of next states corresponding to the plurality of actual switches, a set of present states corresponding to the plurality of actual switches, and a set of present states corresponding to the plurality of dummy switches, and further coupled to provide the dummy signal sequence to the plurality of dummy switches.

11. A switched current steering device comprising:

a plurality of actual switches coupled to receive an input signal sequence that indicates a set of state transitions associated with the plurality of actual switches;

a plurality of dummy switches coupled to receive a dummy signal sequence that indicates a set of state transitions associated with the plurality of dummy switches, the dummy signal sequence indicating state transitions that are mutually exclusive of state transitions indicated by the input signal sequence; and an activation unit corresponding to each dummy switch, each activation unit coupled to receive a signal within the input signal sequence and coupled to provide a signal within the dummy signal sequence to its corresponding dummy switch.

12. A switched current steering device comprising:

a plurality of actual switches coupled to receive an input signal sequence that indicates a set of state transitions associated with the plurality of actual switches;

a plurality of dummy switches coupled to receive a dummy signal sequence that indicates a set of state transitions associated with the plurality of dummy switches, the dummy signal sequence indicating state transitions that are mutually exclusive of state transitions indicated by the input signal sequence; and an activation unit corresponding to each dummy switch, each activation unit coupled to receive a next state of an actual switch, a present state of an actual switch, and a present state of its corresponding dummy switch, and further coupled to provide a signal within the dummy signal sequence to its corresponding dummy switch.

13. A switched current steering device comprising:

a plurality of actual switches coupled to receive an input signal sequence that indicates a set of state transitions associated with the plurality of actual switches;

a plurality of dummy switches coupled to receive a dummy signal sequence that indicates a set of state transitions associated with the plurality of dummy switches, the dummy signal sequence indicating state transitions that are mutually exclusive of state transitions indicated by the input signal sequence; a first current source coupled to an actual switch within the plurality of actual switches;

a second current source coupled to a dummy switch within the plurality of dummy switches; and wherein the second current source provides a different amount of current than the first current source.

14. A switched current steering device comprising:

a plurality of actual switches coupled to receive an input signal sequence that indicates a set of state transitions associated with the plurality of actual switches;

a plurality of dummy switches coupled to receive a dummy signal sequence that indicates a set of state transitions associated with the plurality of dummy switches, the dummy signal sequence indicating state transitions that are mutually exclusive of state transitions indicated by the input signal sequence; a first current source coupled to an actual switch within the plurality of actual switches;

a second current source coupled to a dummy switch within the plurality of dummy switches; and wherein the second current source provides less current than the first current source.

15. A switched current steering device comprising:

a plurality of actual switches coupled to receive an input signal sequence that indicates a set of state transitions associated with the plurality of actual switches;

a plurality of dummy switches coupled to receive a dummy signal sequence that indicates a set of state transitions associated with the plurality of dummy switches, the dummy signal sequence indicating state transitions that are mutually exclusive of state transitions indicated by the input signal sequence; and wherein the plurality of actual switches and the plurality of dummy switches form a portion of a Digital to Analog converter.

16. In a switched current steering device that includes a plurality of actual switches and a plurality of dummy switches, a method for reducing noise comprising the steps of:

transitioning the actual switches in response to an input signal sequence; and transitioning the dummy switches in response to a dummy signal sequence such that the number of actual switch state transitions plus the number of dummy switch state transitions is constant independent of the input signal sequence during device operation.

17. In a switched current steering device that includes a plurality of actual switches and a plurality of dummy switches, a method for reducing noise comprising the steps of:

maintaining a number of actual switch state transitions plus a number of dummy switch state transitions constant during device operation;

providing the actual switches with a first operating current; and providing the dummy switches with a second operating current that is different from the first operating current.

18. In a switched current steering device that includes a plurality of actual switches and a plurality of dummy switches, a method for reducing noise comprising the steps of:

maintaining a number of actual switch state transitions plus a number of dummy switch state transitions constant during device operation;

providing the actual switches with a first operating current; and providing the dummy switches with a second operating current that is less than the first operating current.

19. The method of claim 16, wherein a total switching power corresponding to the number of actual switches plus the number of dummy switches remains essentially constant during device operation.

20. In a switched current steering device that includes a set of actual switches and a set of dummy switches corresponding to the set of actual switches, a method for reducing noise comprising the steps of:

determining whether an actual switch will change state during a next switching cycle; and changing a state of a dummy switch during the next switching cycle in the event that the state of the actual switch will remain unchanged during the next switching cycle.

21. The method of claim 20, further comprising the step of maintaining a total switching power corresponding to a number of actual switches plus a number of dummy switches at an essentially constant level during device operation.

* * * * *